United States Patent
Yoshii et al.

(10) Patent No.: US 7,323,725 B2
(45) Date of Patent: Jan. 29, 2008

(54) SEMICONDUCTOR DEVICE

(75) Inventors: Shigeo Yoshii, Hirakata (JP); Nobuyuki Otsuka, Kawanishi (JP); Koichi Mizuno, Nara (JP); Asamira Suzuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 388 days.

(21) Appl. No.: 10/962,492

(22) Filed: Oct. 13, 2004

(65) Prior Publication Data

US 2005/0067615 A1  Mar. 31, 2005

Related U.S. Application Data

(63) Continuation of application No. PCT/JP2004/008163, filed on Jun. 4, 2004.

(30) Foreign Application Priority Data

Jun. 12, 2003  (JP) .............................. 2003-167553

(51) Int. Cl.
*H01L 29/739* (2006.01)
*H01L 31/00* (2006.01)

(52) U.S. Cl. ................. 257/197; 257/14; 257/15; 438/312

(58) Field of Classification Search ............. 257/15, 257/197; 438/312
See application file for complete search history.

(56) References Cited

U.S. PATENT DOCUMENTS 5,844,253 A  12/1998  Kim et al.
6,011,271 A *  1/2000  Sakuma et al. ............... 257/14
2002/0075924 A1 *  6/2002  Mukai ........................ 372/45

FOREIGN PATENT DOCUMENTS

| JP | 9-82900 | 3/1997 |
| JP | 9-116169 | 5/1997 |
| JP | 9-326506 | 12/1997 |
| JP | 10-308526 | 11/1998 |

* cited by examiner

*Primary Examiner*—Jerome Jackson
*Assistant Examiner*—Jami M Valentine
(74) *Attorney, Agent, or Firm*—McDermott Will & Emery LLP (57) ABSTRACT

The present invention relates to a semiconductor device having a multi-layered structure comprising an emitter layer, a base layer, and a collector layer, each composed of a group III-V n-type compound semiconductor in this order; a quantum dot barrier layer disposed between the emitter layer and the base layer; a collector electrode, a base electrode and the emitter layer all connected to an emitter electrode; the quantum dot barrier layer having a plurality of quantum dots being sandwiched between first and second barrier layers from the emitter layer side and the base layer side, respectively and each having a portion that is convex to the base layer; a base layer side interface in the second barrier layer, and collector layer side and emitter layer side interfaces in the base layer having curvatures that are convex to the collector layer corresponding to the convex portions of the quantum dots.

8 Claims, 7 Drawing Sheets

SEMICONDUCTOR DEVICE

This application is a continuation of PCT/JP2004/008163, filed on Jun. 4, 2004.

TECHNICAL FIELD

The present invention relates to a semiconductor device and a fabrication method thereof, in particular to a transistor device that operates in the high-frequency region.

BACKGROUND ART

Figure 9:
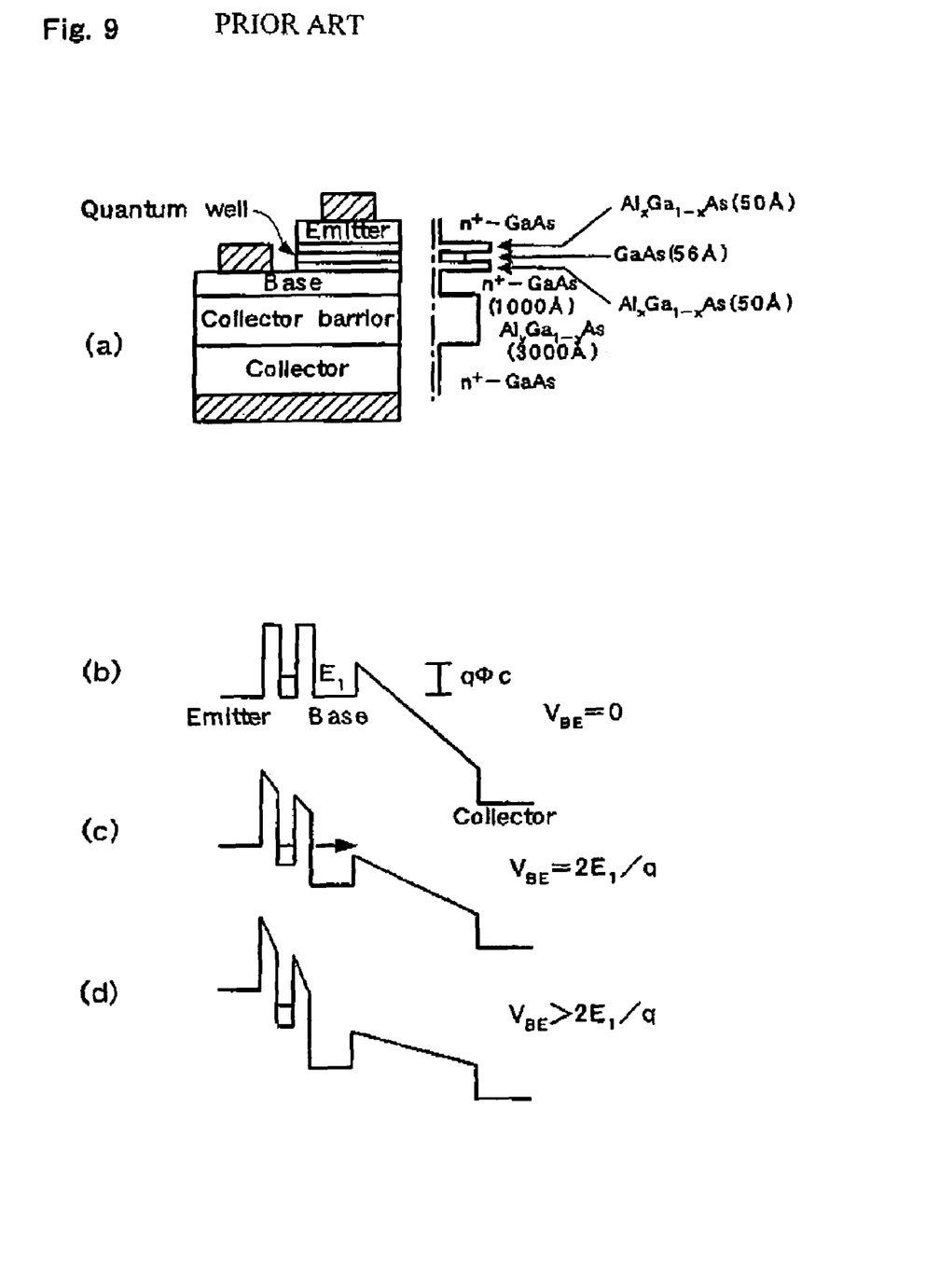
FIG. 9 shows the structure of the semiconductor device of the first prior art technique, and schematically shows its operation.

Several semiconductor devices have been proposed for use as hot-electron transistors (HET), in which high-energy electrons (hot-electrons) are used. A resonant-tunneling hot-electron transistor (RHET) proposed by Yokoyama, et al., in Document 1 (Japan. J. Appl. Phys. Lett. vol. 24, no. 11, p.L 853, 1985) is the first example of a prior art technique. The resonant-tunneling hot-electron transistor comprises a resonant tunneling structure in an emitter region of the HET. FIG. 9(a) shows the structure of the device disclosed in Document 1, and FIGS. (b)-(d) indicate its operating principle.

Document 1 reports the operation of this device at 77 K. Its operation is as follows. When the base and the emitter shown in FIG. 9(a) are equipotential, the electron energy in the emitter is lower than the quantum level ($E_1$) of the quantum well located between the emitter and the base as shown in FIG. 9(b). For this reason, current does not pass through the emitter. When current is applied across the base and the emitter, the electron energy of the emitter matches the quantum level of the quantum well, as shown in FIG. 9(c), thus generating resonant tunneling. To be more specific, the energy of the electrons in the emitter expands with a certain distribution and only those electrons having the same energy level as the quantum level are emitted to the base layer through the resonant tunneling. Because the emitted electrons have high energy, they quickly pass through the base layer with little scattering, cross over the energy barrier ($q\Phi_c$) between the base layer, and the collector barrier layer and are implanted into the collector barrier layer. These electrons also travel through the collector barrier layer with little scattering, and eventually reach the collector layer. In the entire process described above, the device can be expected to operate at a higher speed than an ordinary transistor with scattering or diffusion dependency because the momentum of the electrons is almost unaffected by scattering.

Figure 10:
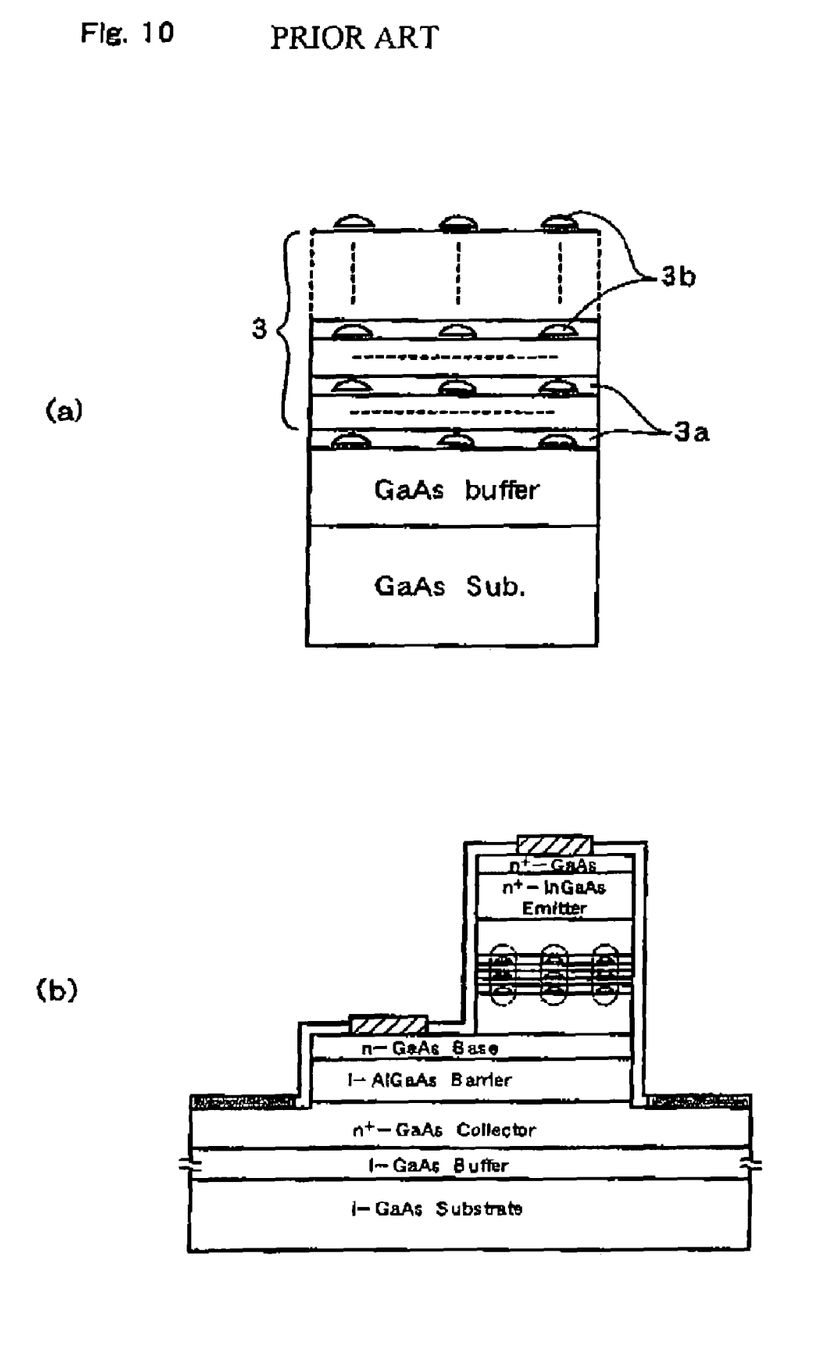
FIG. 10 is a structural drawing of the semiconductor device according to the second prior art technique.

The second example of a prior art technique is a device disclosed in Document 2 (Japanese Unexamined Patent Publication No. 1997-326506) by Sugiyama, et al. This device comprises multi-layered fine particles (quantum dots) instead of the resonant tunneling disclosed in Document 1. FIG. 10 shows the structure of the fine-particle layer (a) and the structure of the HET device (b) disclosed in Document 2. As shown in FIG. 10(a), the device of this prior art technique comprises consecutively deposited GaAs interlayers 3a in an HET emitter region 3, and a plurality of fine particles (quantum dots) 3b that are formed in each interlayer 3a by mutual diffusion. This structure aligns quantum dots 3b in each layer in the vertical direction, forming a virtually single quantum dot. Therefore, the device can operate as a carrier filter exhibiting sharp resonant tunneling characteristics and a sharp energy spectrum.

The devices disclosed in the above documents have the following problems. In the device disclosed in Document 1, the operation temperature is limited, the device gain is low, and the operation speed is not as high as could be expected. For example, in Document 1, operation at 77 K is reported; however, neither operation at room temperature nor the operation speed is disclosed. In the same type of RHET devices for which operation at room temperature is disclosed, the gain is lower than that of an ordinary transistor and its operation speed is not very high.

In contrast, the structure of the multi-layered quantum dot in the device disclosed in Document 2 is too complicated to realize. In other words, to achieve the structure shown in FIG. 10(b), fine particles and buried layers are alternately grown on the base layer in a consecutive manner, and it is necessary to control them so that the locations of the fine particles are identical in all of the layers and the shapes of the particles are uniform. If the fine particles in an upper layer are formed in locations different from those in a lower layer during the fabrication process, the structure shown in FIG. 10(b) cannot be achieved. As described above, because an advanced fabrication technique is needed to obtain a three-dimensional arrangement of fine particles in which a great many fine particles are vertically aligned and whose sizes are uniform, it is extremely difficult to achieve this structure.

The present invention aims to solve the problems of the above-described prior art techniques, and provide a semiconductor device that can be easily fabricated and operates at high speed, and a fabrication method thereof.

DISCLOSURE OF THE INVENTION

A semiconductor device of the present invention is made to solve the above-described problems and comprises: a substrate; a semiconductor multi-layered structure formed on the substrate, the multi-layered structure comprising an emitter layer, a base layer and a collector layer composed of a group III-V n-type compound semiconductor, the base layer lying between the emitter layer and the collector layer; a quantum dot barrier layer lying between the emitter layer and the base layer; a collector electrode, a base electrode and an emitter electrode respectively connected to the collector layer, base layer and emitter layer; wherein the quantum dot barrier layer comprising a plurality of quantum dots and first and second barrier layers sandwiching the quantum dots from the emitter layer side and the base layer side, respectively, and the first and second barrier layers being composed of a semiconductor having a band gap greater than that of the semiconductor composing the quantum dots; each of the quantum dots having a convex portion that is convex to the base layer; and a base layer side interface in the second barrier layer, a collector layer side interface in the base layer, and an emitter layer side interface in the base layer each having curvatures that are convex to the collector layer so as to correspond to the convex portions of the quantum dots.

A method for fabricating a semiconductor device of the present invention is made to solve the above-described problems and comprises the steps of: an emitter layer formation step for forming an emitter layer composed of a group III-V n-type compound semiconductor on a substrate; a step for forming a first barrier layer on the emitter layer; a quantum dot formation step for forming a plurality of quantum dots on the first barrier layer, each quantum dot having a convex portion with an upward convex orientation on the upper surface of the quantum dot; a barrier layer formation step for forming a second barrier layer over the quantum dots, the second barrier layer covering the quantum dots and having curvatures with an upward convex orientation on the upper surface of the second barrier layer so as to correspond to the shape of the convex portions of the quantum dots; a base layer formation step for forming a base layer composed of a group III-V n-type compound semiconductor on the second barrier layer, the base layer having curvatures with an upward convex orientation on upper surface of the base layer so as to correspond to the shape of the convex portions of the quantum dots; a collector layer formation step for forming a collector layer composed of a group III-V n-type compound semiconductor on the base layer; and an electrode formation step for forming an emitter electrode, a base electrode and a collector electrode connected to the emitter layer, the base layer and the collector layer, respectively.

List of documents relating to the present invention
Document 1: Japan. J. Appl. Phys. Lett. vol. 24, no. 11, p. L853, 1985 (see background art)
Document 2: Japanese Unexamined Patent Publication No. 1997-326506 (see background art)
Document 3: Japanese Unexamined Patent Publication No. 2002-184970 (in particular, FIG. 5)
Document 4: Japanese Unexamined Patent Publication No. 1997-82900 (in respect of forming spherical quantum dots in the base layer)
Document 5: Japanese Unexamined Patent Publication No. 1994-20958

| Reference number legend | |
|---|---|
| 101 | Substrate |
| 102 | Emitter layer |
| 103 | Quantum dot barrier layer |
| 103a | First barrier layer |
| 103b | Wetting layer |
| 103c | Quantum dot |
| 103d | Second barrier layer |
| 104 | Spacer layer |

| -continued | |
|---|---|
| Reference number legend | |
| 105 | Base layer |
| 106 | Collector barrier layer |
| 107 | Collector layer |
| 108 | Collector contact layer |
| 110 | Collector electrode |
| 111 | Base electrode |
| 112 | Emitter electrode |
| 113 | High-resistance region |
| $d_1$ | Interface between second barrier layer and spacer layer |
| $d_2$ | Interface between spacer layer and base layer |
| $d_3$ | Interface between base layer and collector barrier layer |

BEST MODE FOR CARRYING OUT THE INVENTION

Figure 1:
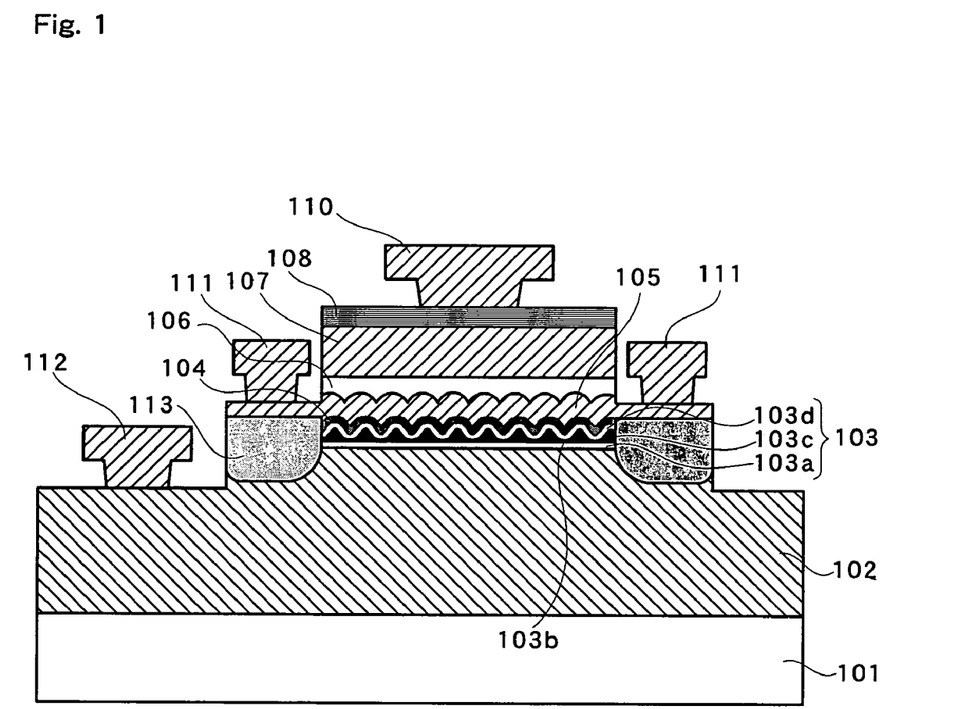
FIG. 1 is a structural drawing showing one embodiment of a semiconductor device according to the present invention.

One embodiment of the semiconductor device of the present invention is explained below with reference to the drawings. FIG. 1 is a cross-sectional view showing a schematic structure of a semiconductor device of the present embodiment.

As shown in FIG. 1, the semiconductor device is composed of a group III-V compound semiconductor, wherein an emitter layer 102 composed of n-type InGaAs is formed on a substrate 101 composed of semi-insulating InP. On the emitter layer 102 are layered a quantum dot barrier layer 103 composed of undoped AlAs in which the latter-described quantum dots are disposed, a spacer layer 104 composed of undoped InGaAs, and a base layer 105 composed of n-type InGaAs, in this order. The quantum dot barrier layer 103, the spacer layer 104, and the base layer 105 are narrower in width (the transverse direction in the figure) than the emitter layer 102, thereby exposing a portion of the top of the emitter layer 102. An emitter electrode 112 is formed on the exposed portion. The spacer layer 104 is composed of a semiconductor having the same chemical constituents as the base layer 105 except that no impurities were intentionally added.

On top of the base layer 105, a collector barrier layer 106 composed of undoped InP, a collector layer 107 composed of n-type InGaAs, a collector contact layer 108 composed of highly-concentrated n-type InGaAs, and a collector electrode 110 are formed in this order, all having widths that are narrower than the base layer 105. A portion of the top of the base layer 105 is exposed on either side of the collector barrier layer 106, and a base electrode 111 is formed on each of the two exposed portions. A high-resistance region 113 is formed below each base electrode 111, i.e., from the bottom portion of the base layer 105 to the top portion of the emitter layer 102.

The preferable thickness of the semiconductor layers is explained below. The thickness of the quantum dot barrier layer 103 is preferably not less than 1.5 nm and not more than 10 nm and more preferably not less than 1.5 nm and not more than 5 nm. When the thickness of the quantum dot barrier layer 103 is not less than 1.5 nm, the layer effectively functions as a barrier against the quantum dots described later, and if it is not more than 10 nm, lattice relaxation can be suppressed. In particular, if the quantum dot barrier layer 103 is not more than 5 nm, a film with high quality can be formed even on the InP substrate 101. From this point of view, in the present embodiment, the thickness of the quantum dot barrier layer 103 is approximately 4 nm. The thickness of other semiconductor layers in the present embodiment are approximately 2 nm for the spacer layer 104, approximately 10 nm for the base layer 105, and approximately 100 nm for the collector barrier layer 106.

The ratio of chemical constituents of the InGaAs used in the present embodiment is In(x)Ga(1−x)As: In content x=0.53, which substantially matches the lattice of InP. The content of In is preferably in the range $0.5 \leq x \leq 0.7$. This enables epitaxial growth on the InP substrate 101, and suppresses scattering. To make the amount of chemical constituents (ratio of chemical constituents) easier to envision, $In_xGa_{1-x}As$ is sometimes shown as In(x)Ga(1−x)As in the present specification.

Figure 2:
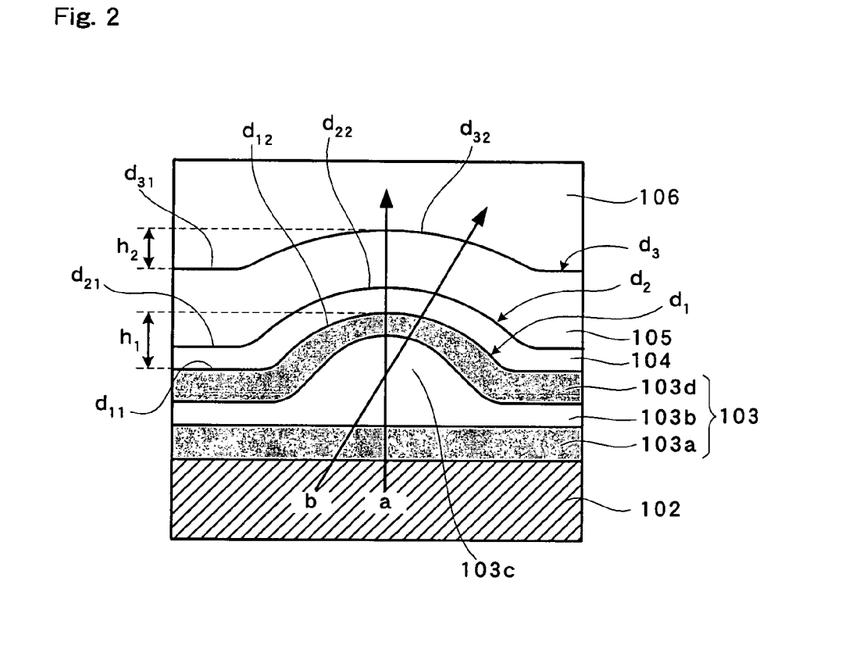
FIG. 2 is a cross-sectional view showing the vicinity of the quantum dot barrier layer.

The quantum dot barrier layer 103 is explained next. FIG. 2 is an expanded sectional view showing the vicinity of the barrier layer. As shown in the figure, the quantum dot barrier layer 103 is composed of a first barrier layer 103a formed on the emitter layer 102, a wetting layer 103b, a plurality of quantum dots 103c, and a second barrier layer 103d, wherein the wetting layer 103b and the quantum dot 103c are sandwiched between the second and the first barrier layers 103d and 103a from the lower and upper sides. The wetting layer 103b is composed of a thin layer of InAs that is approximately one molecule thick, and a plurality of pyramid-shaped quantum dots 103c with an upward convex orientation, i.e., with the upper part of the convex shape facing towards the base layer 105 side, are formed on the wetting layer 103b.

Each quantum dot 103c is composed of undoped InAs fine particles and distributed on a layer that is parallel to the emitter layer 102, i.e., the wetting layer 103b. It is preferable that the size of the quantum dot 103c be such that the length in the width direction of the bottom surface is not less than 2 nm and not more than 30 nm, and the height is not less than 2 nm and not more than 10 nm. For example, it is possible to set the length in the widest direction to approximately 10 nm and the height to approximately 5 nm. Forming a quantum dot 103c with such a size is preferable because it makes it possible to emit electrons that are transmitted at high speed and improves reproducibility when forming quantum dots. Furthermore, it is preferable that the in-plane density of the quantum dot 103c be in the range of $10^{10}/cm^2$ to $10^{12}/cm^2$, and, for example, it can be approximately $5 \times 10^{11}/cm^2$. This makes it possible to attain sufficient device current and to keep an adequate interval between the quantum dots, thus trapping the quantum dots in the transverse direction.

Because the quantum dots 103c are formed into a pyramid shape with the upper part of the convex shape facing in the upper direction as described above, curvatures projecting in the upper direction corresponding to the projections of the quantum dots 103c are formed in the flat portions of the second barrier layer 103d, the spacer layer 104, and the base layer 105 formed on the quantum dots 103c. To be more specific, the interface $d_1$ between the second barrier layer 103d and the spacer layer 104, the interface $d_2$ between the spacer layer 104 and the base layer 105, and the interface $d_3$ between the base layer 105 and the collector barrier layer 106 each has curvatures facing toward the collector layer 107 to correspond to the shape of the quantum dots 103c. Here, it is preferable that the curvatures of the interfaces be such that the distance $h_1$ from the flat portion $d_{11}$ on top of the second barrier layer 103d (interface $d_1$) to the tip of the curved portion $d_{12}$, and the distance $h_2$ from the flat portion $d_{31}$ on top of the base layer 105 (interface $d_3$) to the tip of the curved portion $d_{32}$ satisfy the formula (1) below:

$$\frac{1}{5} \leq h_2/h_1 \leq 1 \qquad (1)$$

This makes it possible to achieve the below-mentioned effects for preventing scattering and/or electron delay.

One example of a method for fabricating a semiconductor device of the present embodiment is explained next. A substrate 101 composed of semi-insulating InP is heated in a molecular beam epitaxial growth (MBE) chamber to clean the surface. An emitter layer 102 composed of n-type InGaAs with Si added is grown by irradiating this surface with molecular beams of In, Ga, As and Si at a substrate temperature of 620° C.

Subsequently, the first barrier layer 103a composed of undoped AlAs is grown by irradiation with molecular beams of Al and As, and the epitaxial growth is then stopped. The lattice constant of the AlAs is then 5.661, which is 3.5% smaller than the 5.869 lattice constant of the InGaAs in the InP substrate 101 and the emitter layer 102. It is possible to cope with this difference in lattice constant merely by making the thickness of the first barrier layer 103a less than the critical level. This suppresses lattice relaxation, and therefore the lattice constant in the barrier layer 103a in the transverse direction becomes substantially the same as that of the substrate 101.

The substrate temperature is then changed to 530° C., and irradiation is conducted with molecular beams of In and As. Because the substrate temperature during InAs growth is in the range of 450° C. to 550° C., setting the temperature in this range is preferable for obtaining excellent quantum dots 103c. Since the lattice constant of InAs is 6.058, which is 3.2% greater than that of the InP substrate 101, the growth of InAs is subject to compressive stress due to lattice distortion. This becomes a so-called Stranski-Krastanov (S-K) growing mode in the above specific temperature range, and uniform quantum dots 103c are formed. Specifically, after growing the first layer to a thickness of approximately one molecule on the entire surface of the first barrier layer 103a as a wetting layer 103b, quantum dots 103c composed of InAs having a pyramid shape of substantially the same size are formed. Because the wetting layer 103b is thin and has a large band gap, the quantum dots 103c function substantially in the same manner as dispersed quantum dots.

The second barrier layer 103d composed of undoped AlAs is grown by irradiation with molecular beams of Al and As. This forms a structure in which a single-layer quantum dot 103c is trapped in the layer 103, which is composed of undoped AlAs, as shown in FIG. 2. The top of the second barrier layer 103d is not flat and a curvature $d_{12}$ curving along the pyramid shape is formed in the portion corresponding to the quantum dot 103c.

Subsequently, the spacer layer 104 and the base layer 105 are epitaxially grown. Here, above the quantum dot 103c, the spacer layer 104 and the base layer 105 also become curved shapes $d_{22}$ and $d_{32}$ reflecting the pyramid shape. The collector barrier layer 106, the collector layer 107 and the collector contact layer 108 are then epitaxially grown.

Thereafter, the substrate with semiconductor layers 102-108 grown thereon is removed from the MBE and then patterned. In other words, a portion of the layered semiconductor layers are removed and a mesa is formed to expose a portion of the emitter layer 102 and the base layer 105. Ion implantation is conducted below the exposed region of the base layer 105, to form a high-resistance region 113. The collector electrode 110 is then formed on the collector contact layer 108, and the base electrode 111 and the emitter electrode 112 are formed on the exposed portions of the base layer 105 and the emitter layer 102, respectively, completing the device. In the above ion implantation step, the high-resistance region can be formed by, for example, implanting $Fe^+$ ions accelerated at 200-800 kV and conducting heat treatment at 600-850° C.

A semiconductor device having such a structure achieves the following effects. To explain the operation of the present invention, the causes of the problems of prior art techniques are clarified below.

In the first prior art technique (Document 1), the operation temperature is limited, the device gain is low, and the operation speed is not higher than expected, as described above. One of the main causes of these problems is the energy distribution of the electrons emitted from the emitter. In the RHET device, a requirement for resonant tunneling between the emitter and the base is that the z-direction component (here, the direction perpendicular to the quantum well layer is defined as the z direction) of the electron energy substantially match the quantum level ($E_1$) of the quantum well layer. In other words, the energy of the electrons that have passed through the quantum well layer is almost the same, i.e., $E_1$, in the z-direction component; however, there is no limitation to the energy in the x and y directions. As a result, the total energy of electrons (the total of the x, y, and z components) exhibits a distribution corresponding to the thermal energy and voltage across the emitter and the base. Because the extent of the energy distribution is small at low temperatures, the energy in the x and y directions is equal; however, as the temperature rises, the distribution of the two expands.

Figure 3:
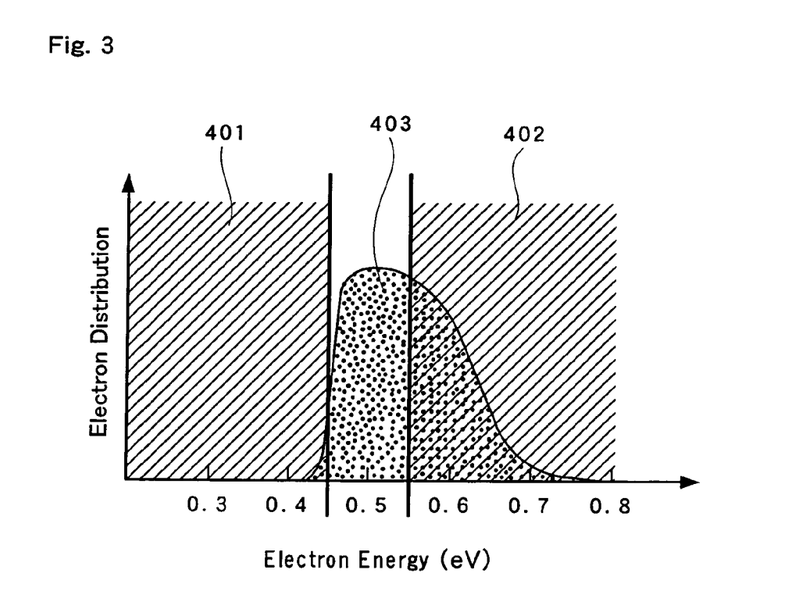
FIG. 3 shows the energy distribution of the emitted electrons of the first prior art technique.

FIG. 3 shows the energy distribution 403 of the electrons emitted from the quantum well layer to the base layer at room temperature in the RHET device of the first prior art technique.

It is preferable that the electron speed and electron energy be higher to allow the electrons emitted from the emitter region to reach the collector region without suffering from lattice scattering, and the mean free path of electrons (scattering life multiplied by electron speed) must be the same or greater than the traveling distance of the electrons in the device. However, if the electron energy is too high, scattering will be caused by intervalley transfer (r-L intervalley transfer) in the energy band of the semiconductor, thereby decreasing the electron speed remarkably because the electrons will shift to L valley that exhibits large effective mass and low speed.

In FIG. 3, this relationship is simplified and a low-energy region (the shaded area on the left) 401 and a high-energy region (the shaded area on the right) 402 are shown. The low-energy region 401 indicates a region in which the electron speed is low and the mean free path is less than the traveling distance of the electrons, and the high-energy region 402 indicates a region that is subjected to scattering due to intervalley transfer. The characteristics of the regions depend on the structure of the device and the materials of the semiconductor; however, the estimated results relative to an RHET device using the InGaAs/InP of the first prior art technique are explained here.

Because the electron energy distribution 403 emitted from the quantum well is as described above, some of the electrons are distributed to the high-energy region 402. When the energy of the quantum level is reduced to prevent such distribution, the distribution of the electrons spreads in the low-energy region 401 and this causes electron collision and/or scattering, which makes it impossible to obtain ballistic conduction. Even if the quantum level or electrical potential of the emitter is controlled, the ratio of the electrons that can pass between the base and the collector at high speed is approximately 40%. When the voltage across the base and the emitter is modulated during high-frequency operation, the number of emitted electrons changes, but the change is slow due to the spread of the electron energy distribution. Here, the shape of the electron energy distribution changes and the point of the distribution peak also changes due to changes in the quantum level, which are attributable to the change of the voltage across the base-emitter. As a result, it becomes difficult to keep the energy peaks of the emitted electrons in the region in which electrons can be transmitted at high speed throughout the modulated operation, further reducing the ratio of the electrons that can travel at high speed.

When the ratio of the low-speed electrons is relatively large compared to high-speed electrons, the device response reflects the delay of the low-speed electrons. When scattering begins due to the low-speed electrons, the lattice temperature increases and the probability of electron scattering further increases. The scattered electrons are not only delayed but also lose energy, so some of them are not able to pass over the collector barrier. As a result, the base current increases and the current gain falls.

As described above, in the first prior art technique, because the speed distribution of the electrons emitted from the emitter at room temperature is wide, it is difficult to achieve operation with gain and high-frequency characteristics across a wide temperature range.

In the second prior art technique (Document 2), it is disclosed that the device exhibits sharp resonant tunneling characteristics because it comprises a plurality of layers having quantum dots, and the device functions as a carrier filter with a sharp energy spectrum. However, as described above, since the configuration of the multi-layered quantum dot of the second prior art technique is complicated, it is difficult to actually fabricate it.

Growing multi-layered quantum dots formed in substantially the same location is difficult; however, if the same effects can be obtained using a single-layer quantum dot, the fabrication of the device becomes easier. Nonetheless, using a single-layer quantum dot in the electron-emitting region in the HET renders other problems as follows. These problems are explained in detail below with reference to FIG. 4.

Figure 4:
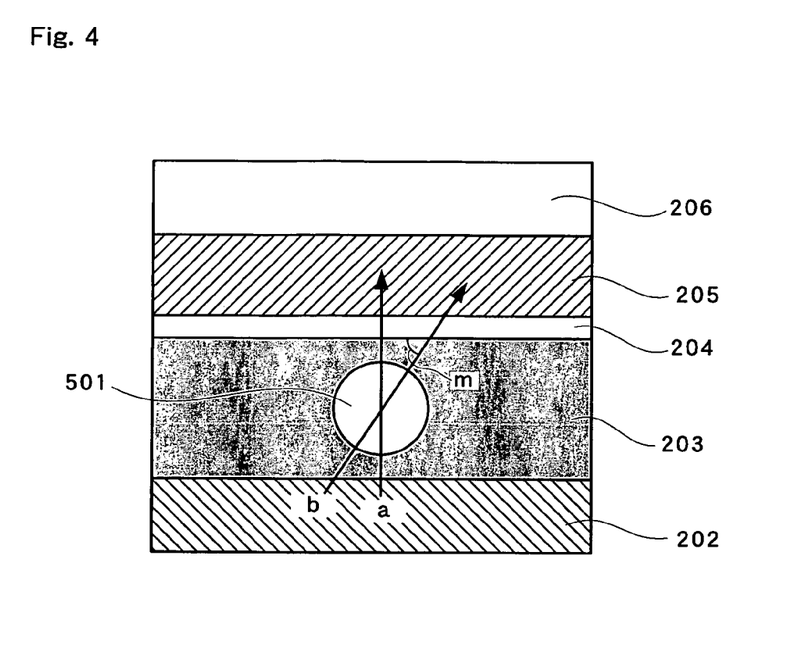
FIG. 4 shows an example of a semiconductor device having a flat-layered structure, with a cross-sectional view of the vicinity of the quantum dot thereof.

FIG. 4 shows a flat-layered structure of a device in which a spherical quantum dot 501 is provided in a quantum dot barrier layer 203. When a voltage is applied across the emitter layer 202 and the base layer 205, electrons among those in the emitter layer 202 having energy that substantially matches the quantum level of the quantum dot 501 are emitted to the base layer 205 by resonant tunneling. Because the emitter layer 202 and the base layer 205 three-dimensionally sandwich the quantum dot 501, the direction of electron emission is not limited to being perpendicular to each layer (in the direction shown by arrow a in FIG. 4) but can also be oblique to each layer (in the direction shown by arrow b in FIG. 4).

Energy barriers attributable to changes in the chemical constituents of the semiconductor exist in hetero-interfaces, such as the interface between the second barrier layer 203 and the spacer layer 204, and that between the base layer 205 and the collector layer 206. The electrons obliquely entering these hetero-interfaces are more easily reflected than electrons that are incident in the perpendicular direction. Therefore, when the incident angle m (see FIG. 4) decreases, the efficiency for transmitting electrons also decreases. The electrons emitted in the oblique direction travel longer distances than those emitted in the perpendicular direction do. Because the possibility of scattering is proportional to traveling distance, the electrons incident in the oblique direction tend to scatter more.

Many of the electrons emitted in an oblique direction lose energy due to reflection and/or scattering and are diffused as slow electrons, causing a decrease in the efficiency of electron implantation, an increase in leak current, an increase in operation delay, etc. In other words, it is impossible to obtain excellent device characteristics by merely providing quantum dots between the emitter layer 202 and the base layer 205.

In contrast, the structure of the present embodiment comprises a single layer of quantum dots 103c, and the structure is characterized in that the second barrier layer 103d and the base layer 105 are curved in the vicinity of the quantum dot 103c so as to correspond to the shape of the quantum dot 103c. This structure achieves the effect of preventing electron scattering travel delay even when the electrons are obliquely emitted.

This is explained in further detail next. In the present embodiment, even when electrons are emitted in the direction oblique to the quantum dot barrier layer 103 as shown by arrow b in FIG. 5, because the portion above the quantum dot 103c, i.e., the second barrier layer 103d, is curved, the incident angle n to the layer 105 increases compared to the structure shown in FIG. 4 and approaches a right angle. When the incident angle n (see FIG. 5) increases as described above, it results in a reduction in reflection and scattering at the interfaces, and also in traveling time delay. Because the base layer 105 is also curved in the same manner, scattering and delay can be prevented when the electrons enter the base layer 105 or the collector barrier layer 106. As described above, the present embodiment achieves the effects of preventing electron scattering and delay even when the electrons are emitted obliquely.

Figure 5:
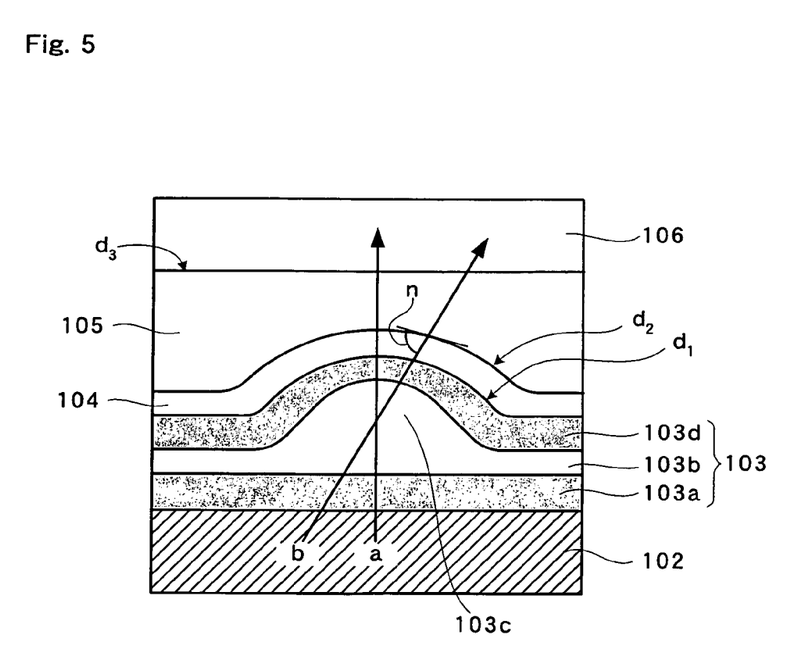
FIG. 5 shows an example of a semiconductor device having a layered structure whose top surface is flat, with a cross-sectional view of the vicinity of the quantum dot thereof.

To achieve the above effects, it is not sufficient to, for example, provide only a curvature to the bottom of the base layer 105, as shown in FIG. 5. It is also necessary to provide curvatures to the bottom $d_2$ of the base layer 105 and the top $d_3$ of the base layer, as shown in FIG. 2. This arrangement makes it possible to more effectively prevent electron scattering and delay when the electrons enter the collector barrier layer 106.

Furthermore, because the interface between the second barrier layer 103d and the spacer layer 104 is curved, the second barrier layer 103d can be made thinner in the flat region where no quantum dots 103c exist. Accordingly, the thickness of the entire quantum dot barrier layer 103 can be made thinner. This makes it possible to prevent a decrease of crystal quality when a quantum dot barrier layer 103 having a lattice constant that is different from that of the substrate 101 is formed as in the present embodiment.

The second prior art technique shown in FIG. 10 has pyramid-shaped quantum dots; however, because the semiconductor layers sandwiching these dots are flat, the above effects cannot be obtained. Even if the layers above the quantum dots in the second prior art technique were curved, the above effects could not be obtained because the direction in which electrons are emitted is opposite to that of the present embodiment, so the electrons are emitted from the narrower side of the quantum dot to the wider side thereof.

Figure 6:
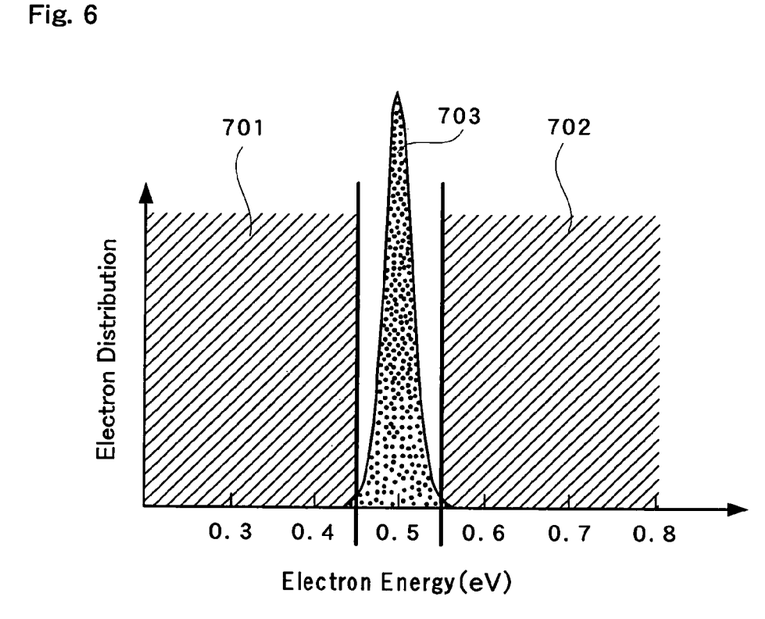
FIG. 6 shows the energy distribution of the emitted electrons of the semiconductor device shown in FIG. 1.

The energy distribution of the electrons emitted from the base layer of the semiconductor device of the present embodiment is explained next. FIG. 6 shows the distribution of the total energy of the electrons emitted through the quantum dots at room temperature in the present embodiment. Here, because the energy of the electrons emitted through the quantum dots 103c, in the x, y and z directions, is defined by the quantum level, the energy distribution 703 is sharp. It is readily possible to position the center of the distribution between the low-energy region 701 and the high-energy region 702 by controlling the quantum level. Furthermore, because the energy distribution is sharp, changes in the number of emitted electrons are also made quickly when the voltage is modulated across the base and the emitter, thus preventing the emission of slow electrons due to changes in the peak points.

In the present embodiment, by setting the center of the energy distribution of emitted electrons in a range of not less than 0.45 eV to not more than 0.55 eV from the bottom of the conduction band of the base layer 105, it is possible to make 90% or more of the emitted electrons travel at high speed even during modulation. Furthermore, because not many electrons lose energy due to scattering, the base current decreases, thus giving the device high gain across a wide temperature range.

In the region where the base electrode 111 is formed above the emitter layer 102, because there is no collector layer 107 formed thereabove, the emission of electrons from the emitter layer 102 to the base layer 105 causes base current (leak current). In contrast, in the present embodiment, a high-resistance region 113 is formed below the base electrode 111, as shown in FIG. 1. There is therefore no electron emission from the emitter layer 102 to the collector layer 107 in this region, thus preventing the generation of leak current.

As described above, the structure of the present embodiment makes it possible to provide a novel semiconductor device that is easier to fabricate and operates at high speed across a wider temperature range than conventional semiconductor devices.

One embodiment of the present invention is explained above; however, the scope of the present invention is not limited to this and various modifications may be made as long as they do not depart from the sprit of the present invention. For example, in the above embodiment, the quantum dot 103c is composed of InAs and the first and second barrier layers 103a and 103d are composed of AlAs; however, it is possible to use other material combinations having different energy levels relative to an electric charge. For example, by using InGaAs mixed crystal as the quantum dot 103c and controlling the content of In in the range of 0 to 0.3, it is possible to control the depth of the quantum well. Furthermore, by using InAlAs (with In content of 0 to 0.5) as the first and second barrier layers 103a and 103d, the lattice mismatch between those layers and the InP substrate can be reduced and the quality of the crystal can be improved.

The band gap of the semiconductor composing the quantum dot 103c must be smaller than those of the semiconductors composing the first barrier layer 103a and the second barrier layer 103b. Otherwise, the electrons emitted from the emitter layer 102 will not be collected by the quantum dot 103c (i.e., the electrons will not pass through the quantum dot 103c). The ratio of the chemical constituents of the semiconductors composing the first barrier layer 103a and the second barrier layer 103b need not be the same as long as this requirement is met; however, for designing purposes, it is preferable that the chemical constituents thereof are the same.

Figure 7:
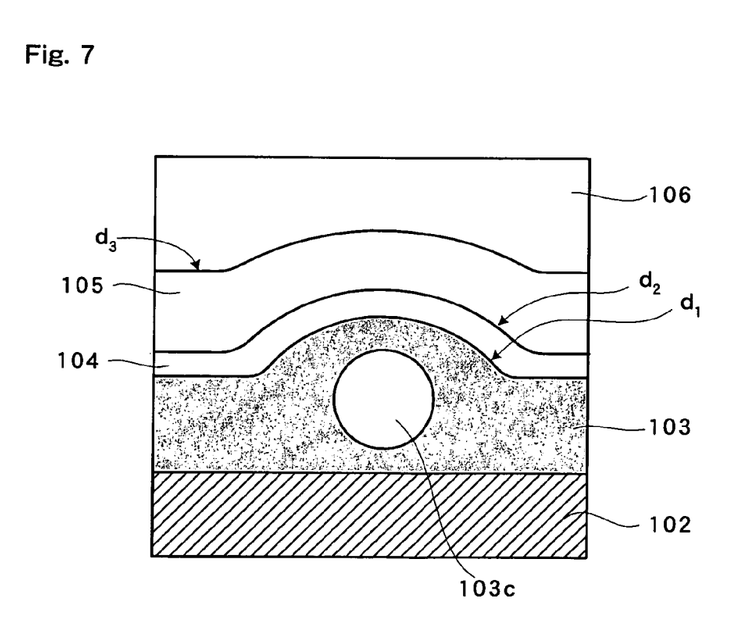
FIG. 7 shows another example of the semiconductor device of FIG. 1, with a cross-sectional view of the vicinity of the quantum dot barrier layer.

In the above embodiment, the quantum dot 103c is formed into a pyramid shape with an upward convex orientation;

however, the shape is not limited to this as long as it has a convex portion that becomes narrower as the top thereof approaches the collector layer 106. For example, it may be conical shape or like cone-like shapes, a hemispheric shape, etc. Furthermore, because it is only required that the surface facing the collector layer 106 is convex, the shape of the surface facing the emitter layer is not limited. Therefore, it is possible to form the quantum dot 103c into a spherical shape as shown in FIG. 7. In this case, it is preferable that the particle size of the quantum dot 103c be not less than 2 nm and not more than 30 nm, and this arrangement makes it possible to obtain a quantum level that can emit electrons that travel through the base layer at high speed.

The above embodiment describes a method for fabricating a device using MBE that exhibits excellent characteristics for controlling the production of fine particles; however, other epitaxial growth methods, including metal organic chemical vapor deposition (MOCVD), may also be employed.

In the above embodiment, a method in which quantum dots are produced in the S-K mode is explained; however, the same structure can be obtained by employing other methods, e.g., forming a quantum dot convex to the collector layer by using a slanted substrate and then conducting buried growth, etc.

Figure 8:
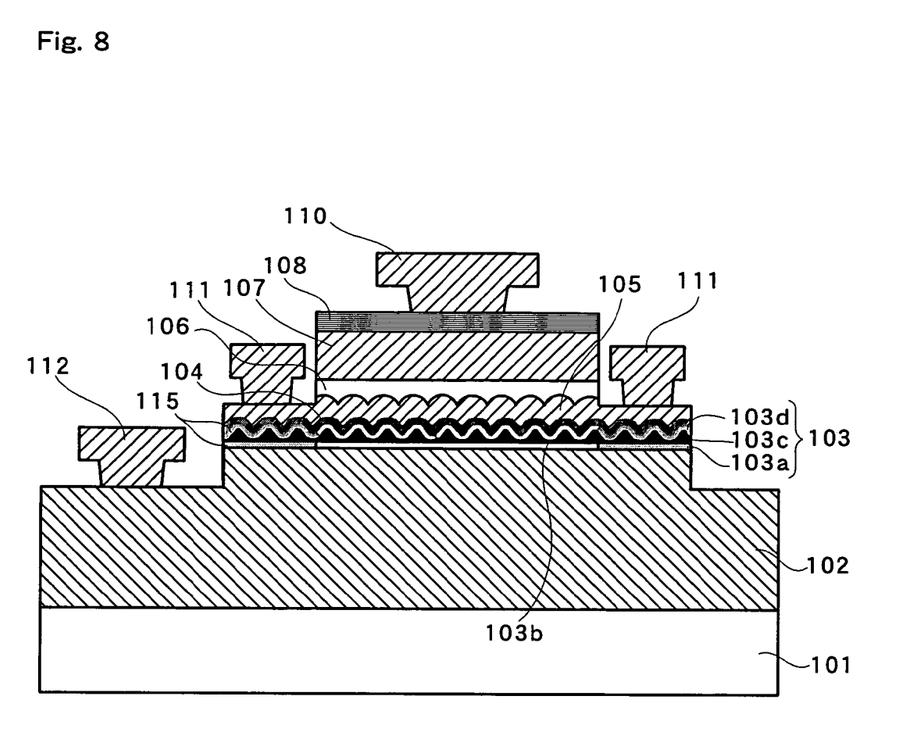
FIG. 8 is a cross-sectional view of another example of the semiconductor device of FIG. 1.

In the above explanation, the high-resistance region 113 is formed below the base electrode 111 by ion implantation; however, it is also possible to employ a selective oxidation method as described below. In the semiconductor device of the above-described embodiment, level differences are formed by removing a portion of each layered semiconductor to expose a portion of the base layer 105 and the emitter layer 102, and the base electrode 111 and the emitter electrode 112 are formed thereon; however, it is also possible to supply water vapor before forming the electrodes while providing a mask in such a manner that the portions of the above-described level differences are exposed. The first and second barrier layers 103a and 103d exposed in the steps, i.e., the semiconductor layers containing Al, are oxidized toward the inner side as shown in FIG. 8. By stopping the supply of water vapor when the oxidization progresses to the desired width (in the transverse direction), a high-resistance region 115 is formed below the base electrode 111. Alternatively, by partially removing a portion between the base layer 105 and the emitter layer 102 by selective etching, it is possible to form a region to which electric current does not flow.

The semiconductor composing the semiconductor device of the present invention is not limited to those described in the above embodiments as long as they are GaAs, AlAs, InAs, GaP, AlP, InP, GaN, AlN, InN or like group III-V compound semiconductor materials. Usable examples include, in addition to secondary materials, AlGaAs, GaInP, AlGaInP, InGaAsP, AlGaN, InGaN or like ternary mixed crystal materials and quaternary mixed crystal materials. The above-mentioned compound semiconductors and substrates composed of semiconductors or insulators having lattice constants close to those of the compound semiconductors may be used as the substrate of the semiconductor device of the present invention. For example, when GaAs is used as a substrate, GaAs may be used as the emitter layer, the spacer layer, the base layer and the collector layer, AlAs may be used as the first and the second barrier layers, InAs may be used as the quantum dots, and $Al(x)Ga(1-x)As$: $x<0.4$ may be used as the collector barrier layer. Further-more, it is possible to prevent electron scattering by using $In(x)Ga(1-x)As$: $x<0.2$ instead of GaAs as the base layer and the spacer layer.

In the above embodiments, the emitter layer, the base layer and the collector layer are formed on the substrate in this order to make the electrons travel from the bottom to the top; however, it is also possible to form the layers in the order opposite to this. In other words, the collector layer, the base layer and the emitter layer can be formed on the substrate in this order to make electrons travel from the top to the bottom. In this case, the structure of the quantum dot barrier layer is also opposite to the above in the vertical direction. In other words, it is necessary to form the quantum dots so that they are convex in the downward direction. Accordingly, it is necessary that the second barrier layer, the spacer layer and the base layer, which are below the quantum dots, have a convex curve in the downward direction so as to correspond to the shape of the quantum dot.

INDUSTRIAL APPLICABILITY

As described above, the novel semiconductor device of the present invention can be easily fabricated and operates at high speed.

The invention claimed is:

1. A semiconductor device comprising:
   a substrate;
   a semiconductor multi-layered structure formed on the substrate, the multi-layered structure comprising an emitter layer, a base layer and a collector layer composed of a group III-V n-type compound semiconductor, the base layer lying between the emitter layer and the collector layer;
   a quantum dot barrier layer lying between the emitter layer and the base layer;
   a collector electrode, a base electrode and an emitter electrode respectively connected to the collector layer, base layer and emitter layer;
   wherein the quantum dot barrier layer comprising a plurality of quantum dots and first and second barrier layers sandwiching the quantum dots from the emitter layer side and the base layer side, respectively, and the first and second barrier layers being composed of a semiconductor having a band gap greater than that of the semiconductor composing the quantum dots;
   each of the quantum dots having a convex portion that is convex to the base layer;
   a spacer layer being sandwiched between the quantum dot barrier layer and the base layer;
   a collector barrier layer being sandwiched between the base layer and the collector layer;
   the interface between the emitter layer and the quantum dot barrier layer being parallel to the surface of the substrate;
   the interface between the second barrier layer and the spacer layer having a curved portion convex to the collector layer;
   the base layer having a curved portion convex to the collector layer;
   the interface between the spacer layer and the base layer having a curved portion convex to the collector layer; and
   the interface between the base layer and the collector barrier layer having a curved portion convex to the collector layer.

2. A semiconductor device according to claim 1, wherein the quantum dot is formed in a cone-like shape that is convex to the base layer.

3. A semiconductor device according to claim 2, wherein the cross-section of each quantum dot has a substantially triangular profile, and the length of the bottom of the triangular profile is not less than 2 nm and not more than 30 nm, and the height of the triangular profile is not less than 2 nm and not more than 10 nm.

4. A semiconductor device according to claim 1, wherein the thickness of the quantum dot barrier layer is not less than 1.5 nm and not more than 10 nm.

5. A semiconductor device according to claim 1, wherein the emitter layer, base layer and collector layer are layered in this order on the substrate.

6. A semiconductor device according to claim 1, wherein the second barrier layer has a flat portion and the base layer has a flat portion, and wherein the distance $h_1$ from the flat portion of the second barrier layer to the top of the curvature in the second barrier layer, and the distance $h_2$ from a flat portion of the base layer to the top of the curvature in the base layer satisfy the formula $1/5 \geq h_2/h_1 1$.

7. A semiconductor device according to claim 1, wherein the in-plane density of quantum dots is not less than $10^{10}/cm^2$ and not more than $10^{12}/cm^2$.

8. A semiconductor device according to claim 1, wherein the base electrode is formed on the surface of one side of the base layer, and a high-resistance region is formed between the base layer and the emitter layer at the portion corresponding to the base electrode.

* * * * *

UNITED STATES PATENT AND TRADEMARK OFFICE
CERTIFICATE OF CORRECTION

PATENT NO. : 7,323,725 B2
APPLICATION NO. : 10/962492
DATED : January 29, 2008
INVENTOR(S) : Shigeo Yoshii et al.

It is certified that error appears in the above-identified patent and that said Letters Patent is hereby corrected as shown below:

In column 14, line 5, please change "layer satisfy the formula $1/5 \geq h_2/h_1$ 1." to --layer satisfy the formula $1/5 \leq h_2/h_1 \leq 1$.--

Signed and Sealed this

Twenty-third Day of September, 2008

JON W. DUDAS
*Director of the United States Patent and Trademark Office*